United States Patent [19]

McAdams

[11] Patent Number: 4,561,702
[45] Date of Patent: Dec. 31, 1985

[54] CMOS ADDRESS BUFFER CIRCUIT
[75] Inventor: Hugh P. McAdams, Houston, Tex.
[73] Assignee: Texas Instruments Incorporated, Dallas, Tex.
[21] Appl. No.: 608,605
[22] Filed: May 9, 1984
[51] Int. Cl.[4] .................. H03K 19/096; H03K 19/017; H03K 3/037; G11C 8/00
[52] U.S. Cl. .................... 307/475; 307/362; 307/279; 365/230
[58] Field of Search ............... 307/475, 451, 270, 279, 307/288, 362; 365/191, 230

[56]  References Cited
U.S. PATENT DOCUMENTS

| 4,031,415 | 6/1977 | Redwine et al. | 307/279 X |
| 4,087,704 | 5/1978 | Mehta et al. | 307/475 X |
| 4,110,639 | 8/1978 | Redwine | 307/279 |
| 4,280,070 | 7/1981 | Reese et al. | 307/475 |
| 4,356,411 | 10/1982 | Suzuki et al. | 307/279 X |
| 4,417,163 | 11/1983 | Otsuki et al. | 307/475 |
| 4,485,317 | 11/1984 | Davies, Jr. | 307/475 |
| 4,496,857 | 1/1985 | Chao | 307/475 |

FOREIGN PATENT DOCUMENTS

| 68047 | 6/1978 | Japan | 307/475 |
| 113192 | 9/1980 | Japan | 307/475 |

OTHER PUBLICATIONS

Lee et al., "A 80ns 5V-Only Dynamic RAM", *IEEE ISSCC 79*; 2 pages; Digest of Technical Papers; 2/15/79.

Primary Examiner—Larry N. Anagnos
Attorney, Agent, or Firm—John G. Graham

[57] ABSTRACT

A CMOS bistable circuit is employed as an address buffer or latch for a semiconductor memory or the like. The circuit includes a pair of differential gated inputs, one from an address terminal, and the other from a reference voltage. The same clock used to gate the inputs also preconditions the circuit to be in a balanced status, and holds off conduction of any transistor in the circuit. In this manner, a circuit of high speed, low power, and minimum complexity is provided.

7 Claims, 2 Drawing Figures

CMOS ADDRESS BUFFER CIRCUIT

BACKGROUND OF THE INVENTION

This invention relates to buffer or latch circuitry, and more particular to a CMOS circuit for use as an address buffer in a semiconductor dynamic read/write memory device.

Bistable latch circuits are used as differential detectors for the address inputs in dynamic RAM devices. An address input terminal of such a device is gated into one input of the bistable circuit, and a reference voltage is applied to the other input. The reference is chosen to be midway between a maximum TTL level zero and a minimum TTL level one. Examples of circuits of this type are shown in U.S. Pat. No. 4,280,070, issued to Reese, White and McAlexander, U.S. Pat. No. 4,031,415, issued to Redwine and Kitagawa, and U.S. Pat. No. 4,110,639, issued to Redwine, all assigned to Texas Instruments.

As the bit density in DRAMs has increased to 256K-bit and 1-Megabit levels, and as the functional specifications of such devices have been made more stringent in timing and broadened to include more addressing modes, the address buffers are required to operate faster and use less power; of course the complexity of the clocking needed should always be minimized.

It is the principal object of this invention to provide an improved address buffer circuit for a semiconductor memory or the like. Another object is to provide a latch circuit of low power consumption, of high speed, of simple construction, and/or with minimum complexity in clocking.

SUMMARY OF THE INVENTION

In accordance with one embodiment of the invention, a CMOS bistable circuit is employed as an address buffer or latch for a semiconductor memory or the like. The circuit includes a pair of differential gated inputs, one from an address terminal, and the other from a reference voltage. The same clock used to gate the inputs also preconditions the circuit to be in a balanced status, and holds off conduction of any transistor in the circuit. In this manner, a circuit of high speed, low power, and minimum complexity is provided.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
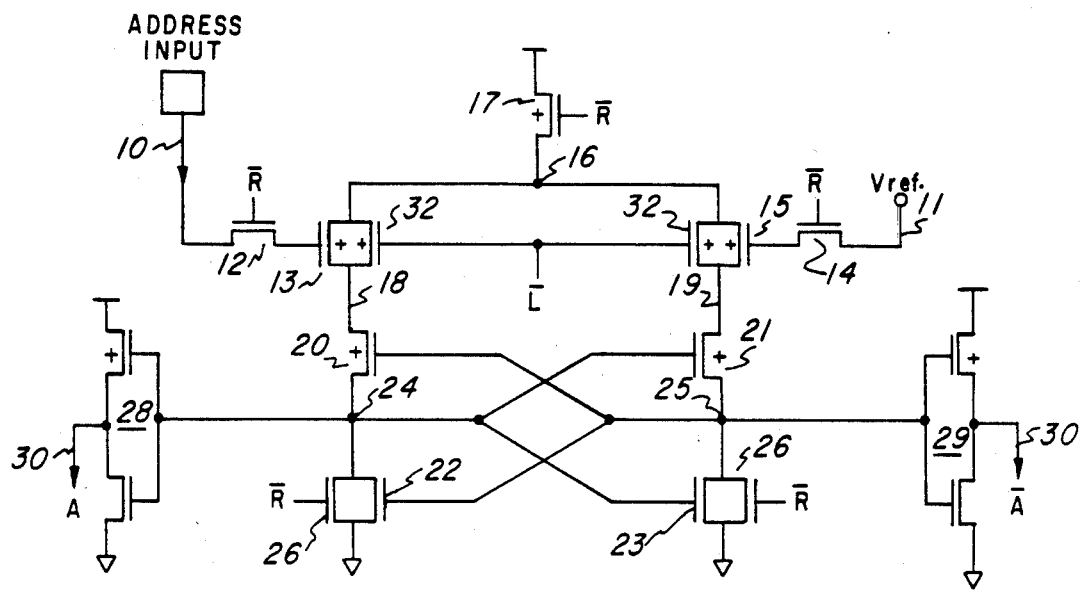
FIG. 1 is an electrical schematic diagram of an address buffer according to the invention.

Referring to FIG. 1, a CMOS address buffer circuit is illustrated according to the invention. The circuit has one input 10 connected to a bonding pad, representing one of the address inputs to a DRAM chip, for example. Another input 11 of the buffer is connected to a reference voltage Vref. The input 10 is connected through the source drain path of a transistor 12 to the gate of P-channel transistor 13. A reference voltage of about +1.5 v is connected from the input 11 through the source-drain path of a transistor 14 to the gate of a P-channel transistor 15. The transistors 13 and 15 are both connected to a node 16 and in series with a P-channel transistor 17; all three of the transistors 12, 14 and 17 have a clock $\overline{R}$ on their gates. Since transistors 12 and 14 are N-channel and the transistor 17 is P-channel, these are turned on by opposite voltages. Thus, when $\overline{R}$ goes low the input voltage which is then at input pin 10 is trapped on the gate of transistor 13, while the reference voltage Vref is trapped on the gate of transistor 15; one of the transistors 13 or 15 (the one having the lower gate voltage) will tend to conduct more when transistor 17 becomes conductive. Nodes 18 and 19 on the low sides of these transistors 13 and 15 are connected to a CMOS double cross-coupled latch having P-channel transistors 20 and 21, and N-channel transistors 22 and 23 with output nodes 24 and 25 at the drains of the N-channel transistors. The nodes 24 and 25 are discharged before each active cycle by transistors 26 having the clock $\overline{R}$ on their gates. Each of the nodes 24 and 25 is connected through a CMOS inverter 28 or 29 to an output node A or $\overline{A}$, producing the true and complement address bits on output lines 30 which go to the row decoder of a DRAM as set forth in U.S. Pat. No. 4,280,870.

Figure 2:
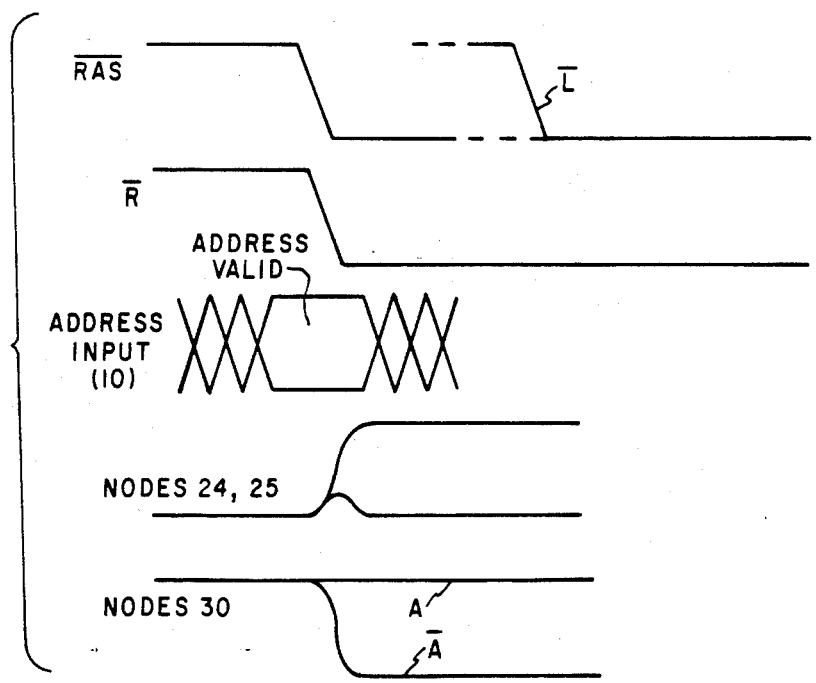
FIG. 2 is a timing diagram showing voltage vs time for various nodes in the circuit of FIG. 1.

During the precharge cycle, $\overline{R}$ is high, and this sets the nodes A and $\overline{A}$ at a high level because transistors 26 will ground the nodes 24 and 25. No power is consumed in the circuit during the precharge cycle because P-channel transistor 17 is off when $\overline{R}$ is high. The gates of transistors 13 and 15 follow the address input 10 and the reference voltage 11, respectively. When $\overline{R}$ goes low in response to an externally-applied control, $\overline{RAS}$ as seen in FIG. 2, the latch is activated. Transistor 17 turns on and node 16 is pulled to Vdd, to act as a supply to both sides. Depending upon the relative magnitudes of the input 10 and the reference voltage 11 either transistor 13 or transistor 15 will be more conductive than the other. The nodes 18, 19, 24 and 25 will all initially rise, but one side will rise faster than the other depending upon which of the transistors 13 or 15 is more conductive. When node 24 or 25 reaches a threshold voltage above Vss, one of the transistors 22 or 23 will turn on, and then regenerative feedback begins due to the cross coupling of devices 21 and 23 to node 24, and devices 20 and 22 to node 25. For example, assume the voltage at node 10 is lower than Vref on input 11; as node 16 rises toward Vdd, transistor 13 will start conducting as soon as node 16 reaches the sum of the voltage on node 10 plus the Vt of P-channel transistor 13. Since Vref is higher than the voltage on node 10, the device 15 has not started conducting yet since its gate is still not a threshold voltage below its source (node 16). This allows node 18 to rise toward Vdd. Since node 25 is still at Vss, transistor 20 is fully conductive and the change in voltage on node 18 is quickly reflected on node 24. Since node 16 rises rapidly, shortly the device 15 will have its gate exceed its threshold voltage and cause it to conduct. However, at no time is transistor 15 more conductive than transistor 13 so that the rate of change of nodes 19 and 25 is less than that of nodes 18 and 24. As soon as node 24 reaches the threshold voltage of transistor 23, this transistor begins to conduct, further reducing the rate of change at node 25. This slower rise at node 25 compared to node 24 causes device 20 to become more and more conductive than device 21, again causing node 24 to rise faster than node 25. As a consequence, node 25 is quickly pulled to Vss and nodes 24 and 18 are allowed to follow node 16 to Vdd. Simultaneously with this latching, the gates of transistors 13 and 15 are isolated from input 10 and Vref respectively, because transistors 12 and 14 are turned off by $\overline{R}$. This allows the input address bit at 10 to change very shortly after initiation of the active cycle without affecting the latching operation, as seen in FIG. 2. Once latching has occurred these inputs can no longer influence the state of the latch due to the isolation to the low side of the latch provided by devices 20 or 21. That is, if node 24 is low, node 25 is at Vdd, and this turns device 20 completely off, thus isolating it from any change in the input 10. Device 12 provides further isolation from input 10 since it is off with $\overline{R}$ low. The behavior is symmetrical should node 25 be low. Due to device 20 being off when node 24 is low there is no power consumed by the buffer after it has settled, regardless of the voltage level of input 10 (other than from leakage currents). This makes the buffer very low powered for the speed at which it switches.

In order to allow very low $\overline{RAS}$ cycles as may be used in static column decode device, for example, a pair of P-channel transistors 32 may be connected across the input transistors 13 and 15. A clock voltage $\overline{L}$ seen in FIG. 2 is connected to the gates of these transistors 32. The function of the transistors 32 is to resupply leakage current on the high side over very long active cycles (e.g., milliseconds in length). The clock $\overline{L}$ is not critical in timing; it may occur perhaps 50 or 100 nsec after $\overline{RAS}$, for example. The transistors 32 and clock $\overline{L}$ are not needed for normal DRAM cycles of less than about 50 microsec.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. An address buffer circuit for a semiconductor memory device or the like, comprising:
   a double cross-coupled CMOS bistable flip-flop circuit having a pair of N-channel driver transistors and a pair of P-channel load transistors, each N-channel transistor having a source-drain path in series with the source-drain path of the corresponding P-channel transistor, the drains of the N-channel transistors providing output nodes, with the gates of the N- and P-channel transistors on each side respectively coupled to the drain of the N-channel driver transistor of the other,
   a pair of P-channel input transistors, each having a souce-drain path in series between the source-drain path of one of said P-channel load transistors and a supply node,
   first and second N-channel gating transistors, the first gating transistor having a source-drain path connected between the gate of one of said pair of input transistors and an input node, the second transistor having a source-drain path connected between the gate of the other of said pair of input transistors and a reference voltage,
   a P-channel supply transistor having a source-drain path connected between said supply node and a voltage supply,
   and a single activating clock voltage connected in common to the gates of said first and second gating transistors and to the gate of said supply transistor.

2. A circuit according to claim 1 including first and second N-channel shunt transistors, each having a source-drain path connected in parallel with the source-drain path of a respective one of said N-channel driver transistors, and each shunt transistor having a gate connected to said activating clock voltage.

3. A circuit according to claim 2 including first and second CMOS inverters, each having an input connected to the output node at the drain of a respective one of said driver transistors, and each said inverter having an output to produce an address or address-complement voltage respectively.

4. A circuit according to claim 3 wherein said address and address-complement voltage are precharged high by P-channel transistors in said CMOS inverters when said shunt transistors are conductive.

5. A circuit according to claim 4 wherein said activating clock voltage is high during an inactive cycle and is low during an active cycle.

6. A circuit according to claim 5 including first and second P-channel shunt transistors, each having a source-drain path connected in parallel with the source-drain path of a respective one of said pair of P-channel input transistors, and means applying a clock voltage to gates of said P-channel shunt transistors in said active cycle at a time delayed from said activating clock voltage going low, to thereby provide resupply of said flip-flop during very long active cycles.

7. A circuit according to claim 1 wherein said activating clock voltage is high during an inactive cycle and is low during an active cycle.

* * * * *